United States Patent
Zeng et al.

(10) Patent No.: US 9,590,658 B1
(45) Date of Patent: Mar. 7, 2017

(54) HIGH-SPEED LOW-POWER LDPC DECODER DESIGN

(71) Applicant: SK Hynix Inc., Gyeonggi-do (KR)

(72) Inventors: LingQi Zeng, San Jose, CA (US); Abhiram Prabhakar, Fremont, CA (US); Jason Bellorado, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 316 days.

(21) Appl. No.: 14/444,712

(22) Filed: Jul. 28, 2014

Related U.S. Application Data

(60) Provisional application No. 61/861,210, filed on Aug. 1, 2013.

(51) Int. Cl.
*H03M 13/00* (2006.01)
*H03M 13/11* (2006.01)

(52) U.S. Cl.
CPC ...... *H03M 13/1131* (2013.01); *H03M 13/112* (2013.01); *H03M 13/1117* (2013.01)

(58) Field of Classification Search
CPC .......... H03M 13/1131; H03M 13/1117; H03M 13/116; H03M 13/1137; H03M 13/112; H03M 13/1171; H03M 13/3746; H03M 13/2948; H04L 1/005; G11B 2020/185
See application file for complete search history.

(56) References Cited

U.S. PATENT DOCUMENTS

| | | | | |
|---|---|---|---|---|
| 2014/0059401 A1* | 2/2014 | Chung | | H03M 13/11 714/752 |
| 2014/0082449 A1* | 3/2014 | Zhang | | H03M 13/1111 714/752 |
| 2014/0173385 A1* | 6/2014 | Li | | H03M 13/1111 714/780 |

OTHER PUBLICATIONS

A. "Reduced-Complexity Decoding of LDPC Codes," J. Chen, A. Dholakia, E. Eleftheriou, M. Fossorier and X.-Y. Hu, IEEE TCOMM, vol. 53, No. 8, Aug. 2005.
"Shuffled Iterative Decoding," J. Zhang and M. Fossorier, IEEE TCOMM., vol. 53, No. 2, Feb. 2005.

* cited by examiner

*Primary Examiner* — Christine Tu
(74) *Attorney, Agent, or Firm* — IP & T Group LLP

(57) ABSTRACT

Decoding an LDPC encoded codeword is disclosed. Variable nodes corresponding to a parity check matrix of the LDPC encoded codeword have been divided into a plurality of groups. A selected group of variable nodes from the plurality of groups of variable nodes is updated. Check nodes are updated using a min-sum update. A selected input value provided from a variable node of the selected group of variable nodes and provided to a certain check node of the check nodes is discarded to be not available for use in a future min-sum update.

23 Claims, 9 Drawing Sheets

HIGH-SPEED LOW-POWER LDPC DECODER DESIGN

CROSS REFERENCE TO OTHER APPLICATIONS

This application claims priority to U.S. Provisional Patent Application No. 61/861,210 entitled HIGH-SPEED LOW-POWER LDPC DECODER DESIGN filed Aug. 1, 2013 which is incorporated herein by reference for all purposes.

BACKGROUND OF THE INVENTION

NAND flash-based storage devices have been widely adopted because of their faster read/write performance, lower power consumption, and shock proof features. One drawback is their relatively higher price as compared to hard disk drives (HDD). In order to bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional BCH codes to overcome the associated noises and the interferences, and therefore improve the data integrity. One such ECC is low-density parity-check (LDPC) code. However, handling LDPC codes requires often requires a large amount of computing and associated power resources. Therefore there exists a need for a high speed and power efficient way to handle LDPC codes.

BRIEF DESCRIPTION OF THE DRAWINGS

Various embodiments of the invention are disclosed in the following detailed description and the accompanying drawings.

DETAILED DESCRIPTION

Figure 1:
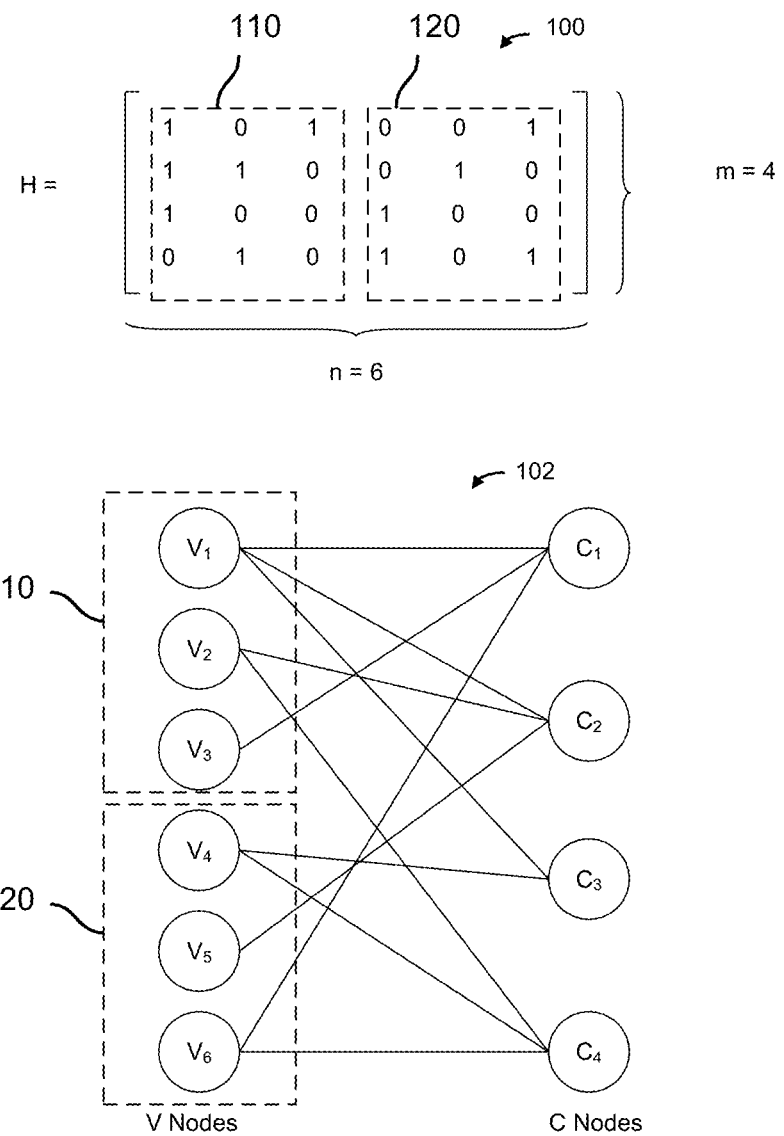
FIG. 1 is a diagram showing an embodiment of an LDPC parity check matrix and a representational graph of the LDPC parity check matrix.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Decoding an LDPC encoded codeword is disclosed. In some embodiments, variable nodes are grouped into a plurality of groups. For example, the variable nodes of an LDPC decoder are divided into separate processing groups. A group of variables is updated. For example, rather than process all the variable nodes together in one update, one group of variable nodes is updated without updating another group of variables to save processing and power resources. Check nodes are updated using a min-sum update. For example, check nodes are updated using the updated messages from the updated group of variable nodes. The scaled min-sum update may utilize a minimum of message values provided from the variable nodes rather than calculating a hyperbolic tangent or an inverse hyperbolic tangent using message values provided from the variable nodes. Certain input values from variable nodes to the check nodes are discarded. For example, calculating the min-sum update using input message data from variable nodes that have been partially updated (e.g., at least one group of variable nodes updated and at least one group of variable nodes not updated) includes utilizing previously determined input data from variable nodes that have not been updated. Memory required to store and track all previously determined input data may be burdensome and certain input values from the variable nodes are discarded and certain input values from the variable nodes are saved for future min-sum update determinations.

FIG. 1 is a diagram showing an embodiment of an LDPC parity check matrix and a representational graph of the LDPC parity check matrix. In the example shown, LDPC parity check matrix 100 has 6 columns (n=6) and 4 rows (m=4).

LDPC decoding includes performing message passing between a network of variable nodes and check nodes which are connected. The connections between variable nodes and check nodes are described by and correspond to the values of the corresponding parity check matrix. Graph 102 shows the network corresponding to LDPC parity check matrix 100. The variable nodes in graph 102 correspond to the column vectors in matrix 100 and the check nodes in graph 102 correspond to the row vectors of matrix 100. The interconnections between the nodes are determined by the values of matrix 100, where a 1 indicates the corresponding check node and variable nodes have a connection and a 0 indicates there is no connection. For example, the 1 in the leftmost column vector and the second row vector from the top in matrix 100 corresponds to the connection between variable node $V_1$ and check node $C_2$.

For example, when the stored data is requested or otherwise desired (e.g., by an application or user), an NAND flash controller accesses storage (e.g., NAND flash storage) and retrieves read data which includes some noise or errors. The NAND controller will process the read data and assign the proper reliability value for each read bit. The reliability value (in general) indicates how certain the decoder is in a given decision. In one example, the reliability value is called log-likelihood ratio (LLR) where the sign indicates the decision (e.g., a positive value corresponds to a "0" decision and a negative value corresponds to a "1" decision) and the magnitude indicates how sure or certain the detector is in that decision (e.g., a large magnitude indicates a high reliability or certainty). In the example of FIG. 1, each variable node is initially provided a corresponding LLR value of data (e.g., corresponding to a 6 bit codeword) read from storage.

In one example standard decoding iteration, each variable node provides a message to its connected check node(s) including a value determined using one or more messages received from check nodes connected to the variable node and updates its estimation of the decoded variable node value based on one or more messages received from check nodes connected to the variable node. In this example, each check node provides a message to its connected variable nodes based on one or more messages received from its connected variable node(s). For example, in one iteration, variable nodes calculate and provide messages to check nodes connected to each respective variable node using previously received messages from connected check nodes, and subsequently, the check nodes calculate messages for variable nodes connected to each respective check node using the received messages from the variable nodes and provide the messages to variable nodes connected to each respective check node for use in a subsequent decoding iteration. In another example, check nodes may be updated before variable nodes.

In some embodiments, rather than updating all variable nodes at the same time concurrently, variable nodes are separated into groups and updated at different times during the iteration. By reducing the number of variable nodes that have to be concurrently updated, the number of circuit devices required may be reduced (e.g., to save chip space). As shown in FIG. 1, matrix 100 is divided into two groups, group 110 and group 120. This division corresponds to grouping variable nodes $V_1$, $V_2$ and $V_3$ as group 110 and grouping variable nodes $V_4$, $V_5$ and $V_6$ as group 120. Using this grouping in one example, in one LDPC decoding iteration, first, variable nodes of group 110 are updated, second, all the check nodes are updated (e.g., using old message values from a previous decoding iteration from group 120 because group 120 has not been updated), third, variable nodes of group 120 are updated, and fourth, all the check nodes are updated again (e.g., using newly updated messages from group 120 and updated messages from group 110). Although dividing nodes into two groups is shown, in various embodiments the nodes may be divided into any number of groups.

In some embodiments, a decoded codeword determined after each decoding iteration (e.g., decoded codeword ĉ) is utilized to determine whether all errors have been corrected to determine the correct codeword (e.g., determine whether ĉH=0).

Figure 2:
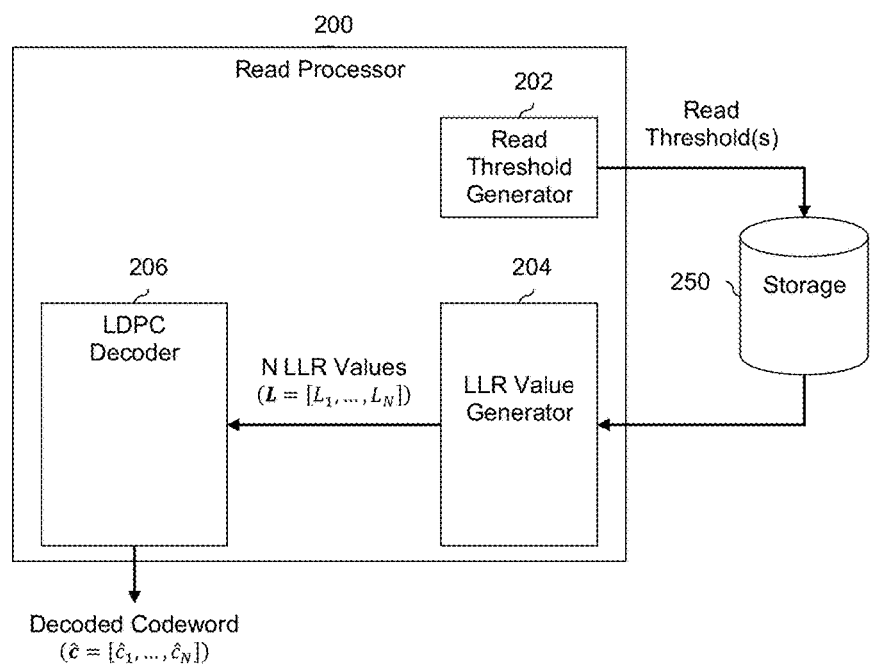
FIG. 2 is a diagram illustrating an embodiment of a storage system, including an LDPC decoder.

FIG. 2 is a diagram illustrating an embodiment of a storage system, including an LDPC decoder. For brevity, a write processor corresponding to read processor 200 is not shown.

Read processor 200 includes read threshold generator 202 which generates one or more read thresholds which are used to read storage 250. In various embodiments, storage 250 may include solid state storage, hard disk storage, removable storage, NAND Flash or 3D NAND. The read threshold(s) output by read threshold generator 202 are used to read a group of N cells (e.g., a page, a segment, etc.) in solid state storage 250.

Initially, only one read of storage 250 is performed (e.g., a desired page or segment containing N cells is read). N hard read values corresponding to those N cells are passed from solid state storage 250 to LLR value generator 204.

When the stored data is requested or otherwise desired (e.g., by an application or user which stored the data), LLR value generator 204 accesses storage 250 and retrieves read data which includes some noise or errors. LLR value generator 204 processes the read data and outputs LLR values for each bit. LLR value generator 204 provides LLR values to LDPC decoder 206 for decoding. If decoding is successful at LDPC decoder 206, then the decoded codeword is outputted.

Figure 3:
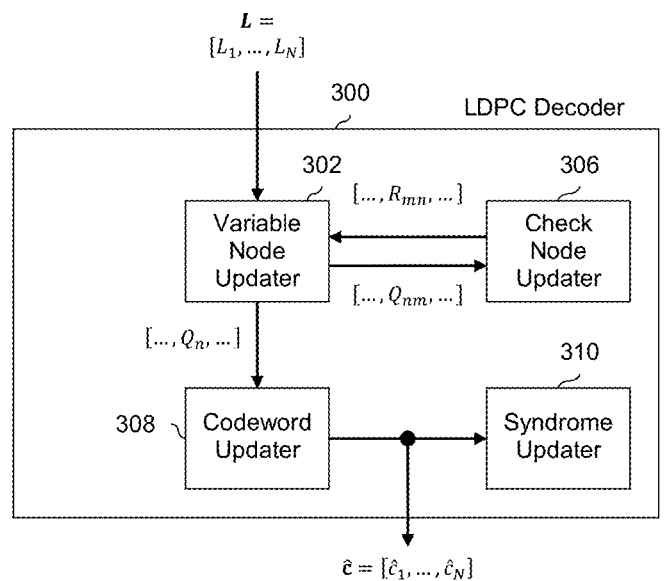
FIG. 3 is a diagram illustrating an embodiment of an LDPC decoder.

FIG. 3 is a diagram illustrating an embodiment of an LDPC decoder. In some embodiments, LDPC decoder 300 is implemented using a semiconductor device, such as a field-programmable gate array (FPGA) or an application-specific integrated circuit (ASIC). In some embodiments, LDPC decoder 300 is included in LDPC decoder 206 of FIG. 2.

In the example shown, LDPC decoder 300 includes variable node updater 302 which generates a message ($Q_{nm}$) which is associated with being sent from variable node n to check node m (e.g., from variable nodes to check nodes shown in FIG. 1). For convenience, such a message may be referred to herein as "a message which is sent from variable node n to check node m." Check node updater 306 outputs message $R_{mn}$ (e.g., from check nodes to variable nodes shown in FIG. 1). As above, a message, associated with being sent from check node m to variable node n, is referred to herein as "a message sent from check node m to variable node n" for convenience.

In the exemplary LDPC decoder shown, an array or sequence of N log-likelihood ratio (LLR) values (i.e., $L=[L_1, \ldots, L_N]$) is input by LDPC decoder 300. For example, LDPC decoder 300 may be used in a storage system and a page or segment containing N cells is read from storage (e.g., solid state storage, NAND flash storage, hard drive storage, etc.). Each of the LLR values is a soft value where the sign indicates a decision (e.g., a negative sign indicates a 1 and a positive sign indicates a 0) and the magnitude indicates the certainty or likelihood associated with that decision (e.g., a larger magnitude corresponds to more certainty in an associated decision).

In addition to generating $Q_{nm}$ messages, variable node updater 302 generates $Q_n$ for $1 \leq n \leq N$. $Q_n$ may be referred to herein as a decoded LLR. These values are passed from variable node updater 302 to codeword updater 308.

For example, codeword updater 308 calculates (for $1 \leq n \leq N$) $\hat{c}=[\hat{c}_1, \hat{c}_2, \ldots, \hat{c}_N]$ using the following:

$$\hat{c}_n = \begin{cases} 0 & \text{if } Q_n \geq 0 \\ 1 & \text{if } Q_n < 0 \end{cases}$$

In some embodiments, the MSB bits of the decoded LLR values (i.e., $Q_n$) comprise the decoded sequence (i.e., $\hat{c}=[\hat{c}_1, \hat{c}_2, \ldots \hat{c}_N]$), so the MSB bits of the decoded LLR values are sent to syndrome updater 310 to decide whether decoding is successful or not. In other words, in some embodiments, codeword updater 308 performs relatively simple processing.

Syndrome updater 310 checks to see if all of the errors have been removed from the codeword. For example, if for parity check matrix H (e.g., matrix 100 of FIG. 1), $\hat{c}H=0$, then syndrome updater 310 determines that decoding is successful and all errors have been removed from the codeword. If so, LDPC decoder 300 stops decoding and outputs $\hat{c}=[\hat{c}_1, \hat{c}_2, \ldots \hat{c}_N]$ as the decoder output.

In some embodiments, if $\hat{c}H \neq 0$, the decoded codeword (i.e., $\hat{c}$) is not output and another decoding iteration is performed (e.g., variable node updater 302 calculates new $Q_{nm}$ messages and new $Q_n$ values, check node updater 306 calculates new $R_{mn}$ messages, and codeword updater 308 calculates a new codeword and checks if the product of the new codeword and the parity check matrix is 0), or until some (e.g., predefined) maximum number of iterations is reached.

Figure 4:
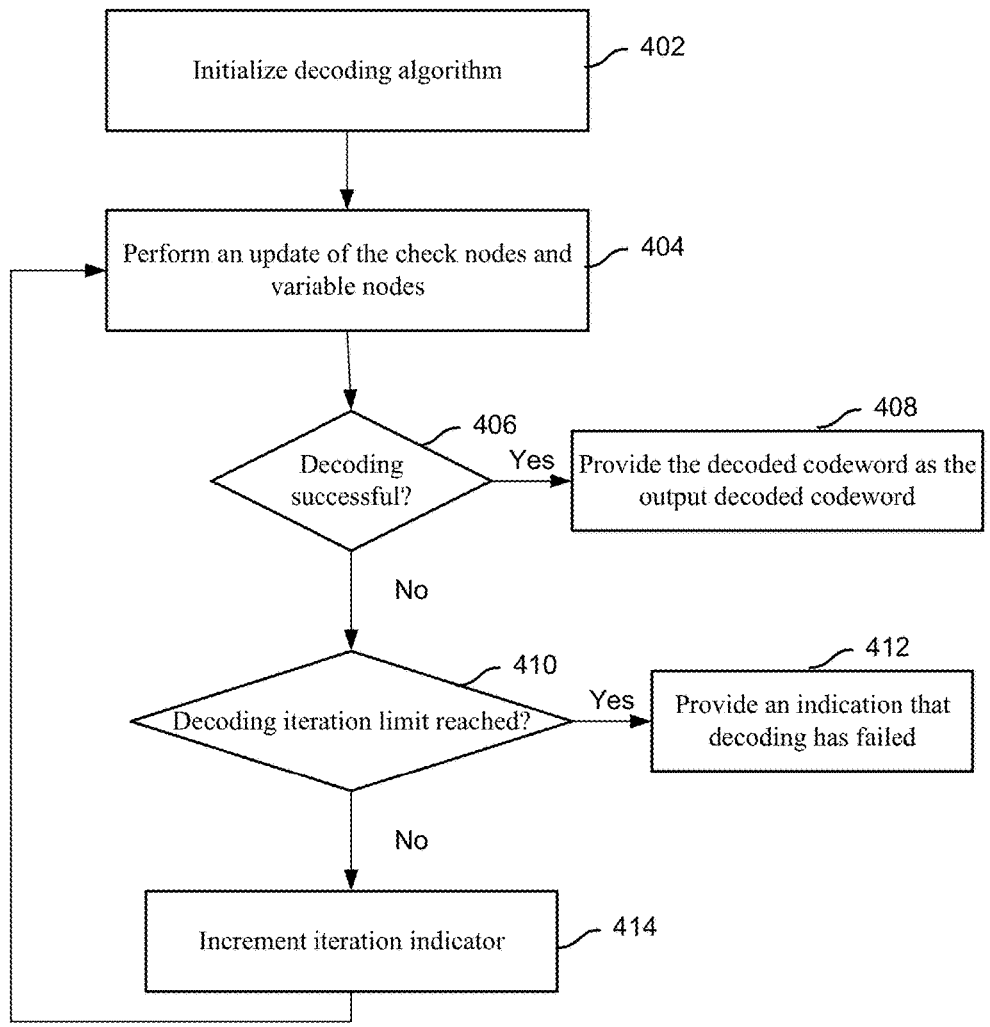
FIG. 4 is a flowchart illustrating an embodiment of a process for performing LDPC decoding.

FIG. 4 is a flowchart illustrating an embodiment of a process for performing LDPC decoding. The process of FIG. 4 may be implemented on LDPC decoder 206 of FIG. 2 and/or LDPC decoder 300 of FIG. 3.

At 402, a decoding algorithm is initialized. In some embodiments, initializing the decoding algorithm includes initializing a decoding iteration counter. For example, a maximum of times an LDPC decoding algorithm may be repeated to decode a codeword is selected and a counter that tracks the current iteration number is initialized to "1" to indicate that currently the first iteration of the LDPC decoding algorithm is being performed. In one example, variable k is the iteration indicator and is initialized as k=1 and $K_{max}$ is initialized as the maximum of iterations allowed to decode one codeword. $K_{max}$ may be preconfigured and/or dynamically determined. In some embodiments, one decoding iteration is completed when all variable nodes and check nodes have been updated at least once during the iteration.

In some embodiments, initializing the decoding algorithm includes initializing a currently processing group identifier. For example, variable nodes are divided into different processing groups and an indicator of which group of nodes is currently being updated is initialized. In one example, variable G is initialized to the total number of variable node groups and variable g, which indicates the identifier of the current group being updated is set as g=1 to indicate that the first group is being updated. In some embodiments, the total number of groups and which nodes are included in which group may be preconfigured and/or dynamically determined.

At 404, an update of the check nodes and variable nodes is performed. In some embodiments, 404 is at least in part performed in variable node updater 302 and/or check node updater 306 of FIG. 3. In some embodiments, updating the check nodes includes calculating updated check node messages (e.g., R-messages) to send to respective connected variable nodes and sending the updated check node messages. In some embodiments, updating the variable nodes includes calculating updated variable node messages (e.g., Q-messages) to send to respective connected check nodes, sending the updated variable node messages, and calculating the respective decoded LLR value (e.g., $Q_n$ value) for each variable node.

In some embodiments, updating the check nodes includes updating check nodes using a min-sum update. For example, rather than utilizing an algorithm that requires a computation of a hyperbolic tangent or an inverse hyperbolic tangent, an algorithm that approximates the hyperbolic tangent or inverse hyperbolic tangent without calculating the inverse hyperbolic tangent or hyperbolic tangent is utilized. Calculating the inverse hyperbolic tangent often requires a lookup table that may utilize valuable resources of an integrated circuit chip. In order to avoid calculating the inverse hyperbolic tangent utilized in traditional check node update algorithms, one or more minimum of message values are calculated to approximate the results of the inverse hyperbolic tangent calculation. In some embodiments, a scaled min-sum update is utilized (e.g., minimum of values multiplied by a scalar value). In some embodiments, an offset min-sum update is utilized (e.g., minimum of values subtracted by an offset value).

In some embodiments, updating the check nodes includes updating each group of a plurality of node processing groups separately. For example, traditionally, all variable nodes are updated together without separating the variable nodes into different update processing groups. However, hardware and/or processing resources required to update all check nodes at the same time may be too large and not be available. In some embodiments, variable nodes are divided into different processing groups and the variable nodes in one group are processed/updated together while other variable nodes in another group may not be updated. In some embodiments, updating of one group of variable nodes is pipelined with updating of another group of variable nodes. For example, updating a group of variable nodes is divided into a plurality of processing stages and once one group of variable nodes has completed the first processing stage and moved on to the second processing stage, a new group of variable nodes begins its update process in the first processing stage.

Figure 7A:
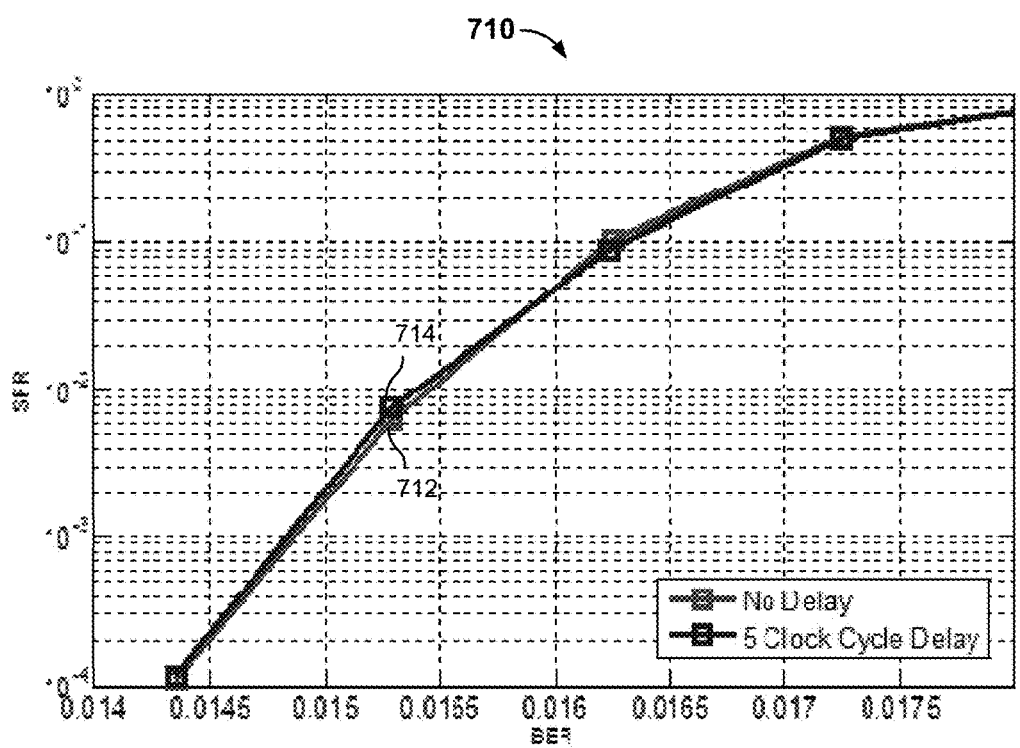
FIG. 7A is a graph showing an experimental simulation of performance comparison between an update clock cycle set to have no delay in node updates and an update clock cycle set shorter and requiring a delay in node updates.

In some embodiments, check nodes are updated after each group of variable nodes is updated. For example, after one group of variable nodes is updated and provides messages to respective check nodes, the check nodes are all updated using the newly provided messages. In some embodiments, at iteration k, after update of a certain group (e.g., group g) of variable nodes, the check node update requires that all the messages from variable nodes in groups 1 to g are the latest updated messages at iteration k. The messages from variable nodes in groups g+1 to G may be the previously updated messages at iteration k−1. However, if multiple clock cycles are set to correspond to the time required to update one group of variable nodes, it may limit decoder throughput by limiting the ability to pipeline variable node updates into multiple processing stages. In some embodiments, a delay is introduced for the requirement of which groups should contain the latest updated variable messages when the check node updates are to begin. For example, at iteration k, after group g of the variable nodes are updated, the check node update only requires the latest updated variable node messages of group 1 and g−d while the messages of variable nodes of groups g−d+1 to G (G is the total number groups) are only updated at previously iteration k−1. By introducing the delay, check node updates and variable node updates may be effectively interleaved and pipelined to achieve higher decoder throughput. FIG. 7A is a graph showing an experimental simulation of performance comparison between have no delay in node updates and requiring a delay for proper pipelining in node updates. Graph 710 plots bit error rate (BER) vs sector failure rate (SFR) of no delay clock cycle implementation (line 712) as compared to 5 clock cycle delay implementation (line 714). As shown in graph 710, there is minimal difference between the performance of these two implementations.

Returning back to FIG. 4, updating the check nodes may require updated messages from variable nodes of group(s) that have not been updated yet. In some embodiments, for updated messages from connected variable node(s) required to update a check node that has not yet been updated, a previously received message(s) (e.g., old message from previous decoding iteration) from the not yet updated connected variable node(s) are utilized along with the updated message(s) from updated connected variable nodes to update the check node. However, saving all previously received messages from variable nodes of a previous decoding iteration to allow update of check nodes (e.g., for use when updated message is not yet available) may require a large amount of hardware and processing resources that may not be available. In some embodiments, rather than store all previously received messages (e.g., a message includes LLR and its location information) from variable nodes of a previous decoding iteration, only a portion of the previously received messages from variable nodes are saved while another portion of the previously received messages from variable nodes is not saved (i.e., discarded). A saved message may include LLR and its associated location information (e.g., the variable node index or the order within all the variable nodes connected to some check node). For example, due to optimization of the min-sum update, saving the three smallest messages from check nodes may closely approximate the accuracy of saving all messages from the check nodes.

Figure 7B:
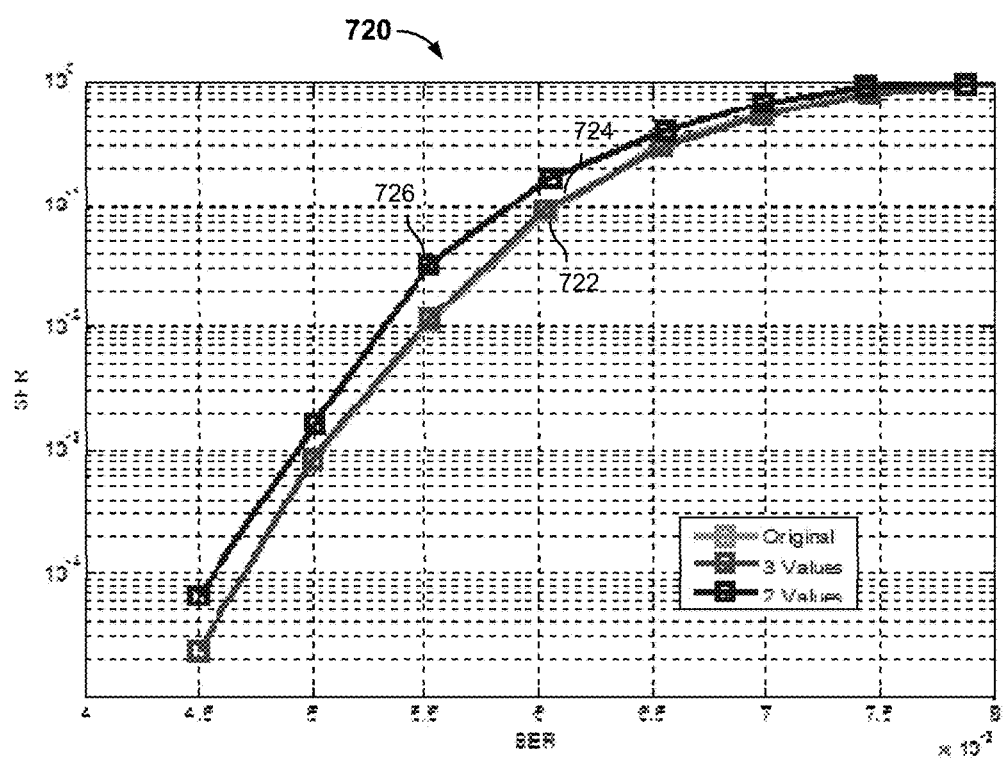
FIG. 7B is a graph showing an experimental simulation of performance comparison between saving different numbers of messages from variable nodes in a decoding iteration.

FIG. 7B is a graph showing an experimental simulation of performance comparison between saving different numbers of messages from variable nodes in a decoding iteration. Graph 720 plots bit error rate (BER) vs sector failure rate (SFR) of saving all variable node message values original implementation (line 722) as compared to 3 message value saving implementation (line 724) and 2 message value saving implementation (line 726). As shown in graph 720, there is almost no difference between the original saving all variable node message values implementation (line 722) as compared to the 3 message value saving implementation (line 724) and a small difference between the original saving all variable node message values implementation (line 722) as compared to the 2 message value saving implementation (line 726).

Returning to FIG. 4, at 406, it is determined whether the decoding has succeeded. In some embodiments, step 406 is at least in part performed by codeword updater 308 and/or syndrome updater 310 of FIG. 3. In some embodiments, determining whether decoding has succeeded includes determining a decoded codeword (e.g., decoded codeword from decoded LLR values). For example, the decoded LLR value $Q_n$ of each variable node n (of N total variable nodes) is decoded to generate decoded codeword $\hat{c}=[\hat{c}_1, \hat{c}_2, \ldots, \hat{c}_N]$ (for $1 \leq n \leq N$) using the following:

$$\hat{c}_n = \begin{cases} 0 \text{ if } Q_n \geq 0 \\ 1 \text{ if } Q_n < 0 \end{cases}$$

In some embodiments, determining whether the decoding has succeeded includes determining whether the decoded codeword multiplied by the parity check matrix equals the syndrome (e.g., an all zero matrix if no error). For example, if for parity check matrix H, $H\hat{c}=0$, then it is determined that decoding is successful and all errors have been removed from the codeword. In some embodiments, if $H\hat{c} \neq 0$, it is determined that decoding has not succeeded.

If at 406 it is determined that decoding has succeeded, at 408, the decoded codeword (e.g., $\hat{c}=[\hat{c}_1, \hat{c}_2, \ldots \hat{c}_N]$) is provided as the output decoded codeword.

If at 406 it is determined that decoding has not succeeded, at 410, it is determined whether the decoding iteration limit has been reached. For example, it is determined whether an iteration indicator is equal to a maximum number of iterations (e.g., $k=K_{max}$ or not, $k<K_{max}$).

If at 410 it is determined that decoding the iteration limit has been reached, at 412 an indication is provided that decoding has failed for the codeword.

If at 410 it is determined that the decoding iteration limit has not been reached, at 414 the iteration indicator is incremented (e.g., k is incremented to next number) and the process returns to 404.

Figure 5:
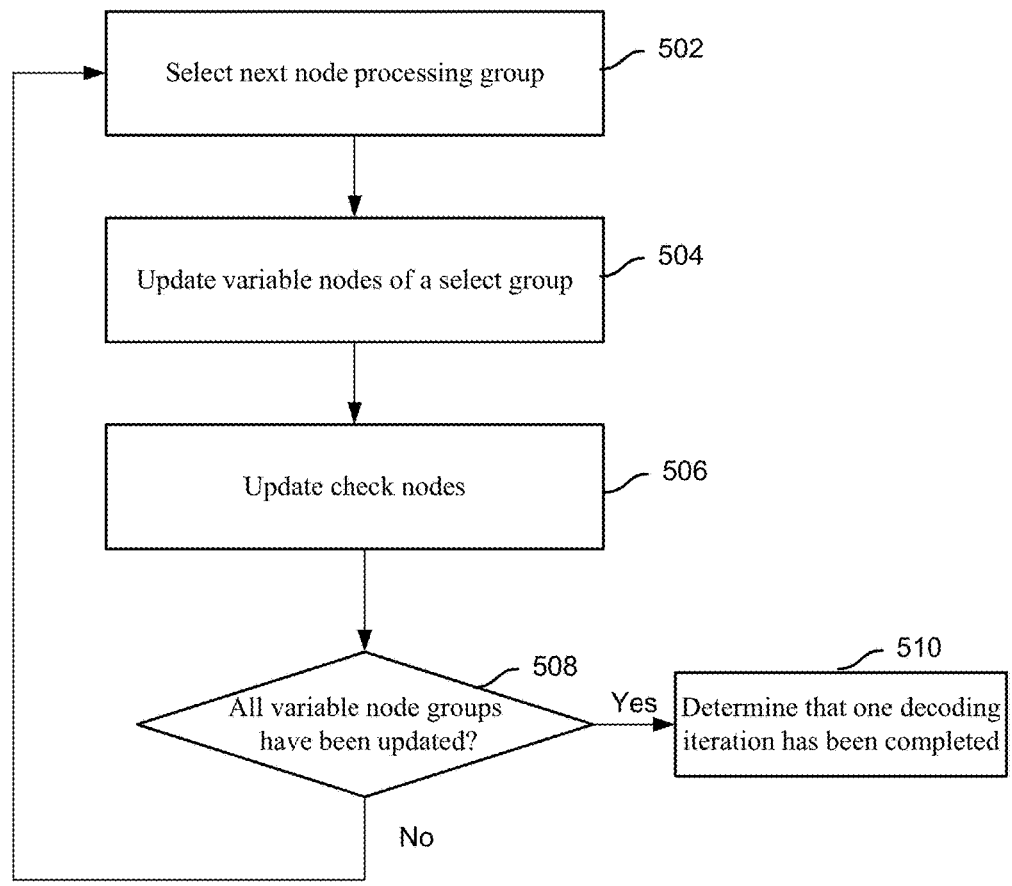
FIG. 5 is a flowchart illustrating an embodiment of a process for updating check nodes and variable nodes of LDPC decoding.

FIG. 5 is a flowchart illustrating an embodiment of a process for updating check nodes and variable nodes of LDPC decoding. The process of FIG. 5 may be implemented on LDPC decoder 206 of FIG. 2 and/or LDPC decoder 300 of FIG. 3. For example, the process of FIG. 5 is implemented on variable node updater 302 and check node updater 306 of FIG. 3. In some embodiments, the process of FIG. 5 is included in 404 of FIG. 4.

At 502, a next node processing group is selected. In some embodiments, selecting the next node processing group includes selecting an identifier of a group of nodes to be updated. For example, variable nodes have been divided into a plurality of processing groups and an identifier of the group of variable nodes to update is selected. In one example, variable g (e.g., initialized 402 of FIG. 4) that identifies the group number of the group of variable nodes to update is obtained.

At 504, variable nodes of a select group are updated. For example, the select group has been identified in 502 (e.g., identified by identifier g). In some embodiments, updating the variable node includes generating for each variable node n (e.g., n is a numeric variable node identifier beginning at 1), a variable node Q-message for each connected check node m (e.g., m is a numeric check node identifier beginning at 1 and $m \in \mathcal{M}(n)$) such that $(g-1) \cdot N_G+1 \leq n \leq g \cdot N_G$, where g is the identifier of the current group of variable nodes to be updated and $N_G$ is the total number of variable nodes in each group.

For example, in the example of FIG. 1, to update group 110 identified as g=1, with $N_G=3$, variable nodes n within $1 \leq n \leq 3$ are updated to send an update Q-message to respective connected check nodes. Thus for variable node n=1 ($V_1$) Q-messages for check node n=1, check node n=2, and check node n=3 are generated. For variable node n=2 ($V_2$) Q-messages for check node n=2 and check node n=4 are generated. For variable node n=3 ($V_3$) Q-message for check node n=1 is generated.

In some embodiments, each generated message may be generalized by the following equation.

$$Q_{nm}^{(k)} = L_n + \sum_{m' \in M(n)\backslash m} R_{m'n}^{(k)} \quad (1)$$

In the above equation, the message $Q_{nm}^{(k)}$ is a message from variable node n to check node m, wherein k is the identifier of the current decoding iteration, g is the identifier of the current group of variable nodes to be updated, "\m" denotes excluding m, $L_n$ is the received soft information (e.g., LLR value received from LLR value generator 204 of FIG. 2) for variable node n, and $R_{mn}$ is the message received from check node m to variable node n.

In some embodiments, updating a variable node includes determining an updated value estimation (e.g., decoded LLR value) for the variable. For example, a soft value that indicates the currently determined likely value of the codeword is determined. In some embodiments, determining the updated value estimation includes determining $Q_n$ as shown in the equation below.

$$Q_n^{(k)} = L_n + \sum_{m \in \mathcal{M}(n)} R_{mn}^{(k)} \quad (2)$$

In some embodiments, in order allow pipelining for the high throughput, R-messages obtained by a delay (e.g., variable d) version of the Q-messages are utilized when performing a variable node update. This allows delay variable d to be added to equations (1) and (2) to arrive at the equations (3) and (4), respectively, below.

$$Q_{nm}^{(k,g)} = L_n + \sum_{m' \in \mathcal{M}(n)\backslash m} R_{m'n}^{(k,g-d)} \quad (3)$$

$$Q_n^{(k,g)} = L_n + \sum_{m \in \mathcal{M}(n)} R_{mn}^{(k,g-d)} \quad (4)$$

At 506, check nodes are updated. In some embodiments, updating the check node includes generating for each check node m (e.g., m is a numeric check node identifier beginning at 1), a check node message for each connected variable node n (e.g., n is a numeric variable node identifier beginning at 1 and $n \in \mathcal{N}(m)$). For example, in the example of FIG. 1, check nodes $C_1$-$C_4$ are updated by each check node generating a message for each connected variable node. In some embodiments, each generated check node message may be generalized by the following equation.

$$R_{mn}^{(k)} = \alpha \left( \prod_{\substack{n' = \mathcal{N}(m)\backslash n \\ n' \leq g \cdot N_G}} \text{sign}(Q_{n'm}^{(k)}) \right) \times \left( \prod_{\substack{n' = \mathcal{N}(m)\backslash n \\ n' \geq g \cdot N_G+1}} \text{sign}(Q_{n'm}^{(k-1)}) \right) \times \quad (5)$$

$$\min \left( \min_{\substack{n' = \mathcal{N}(m)\backslash n \\ n' \leq g \cdot N_G}} |Q_{n'm}^{(k)}|, \min_{\substack{n' = \mathcal{N}(m)\backslash n \\ n' \geq g \cdot N_G+1}} |Q_{n'm}^{(k-1)}| \right)$$

In the above equation, the message $R_{mn}^{(k)}$ is a message from check node m to variable node n, wherein k is the identifier of the current decoding iteration (e.g., k−1 denotes the previous iteration), α is a min-sum update scalar, g is the identifier of the current group of variable nodes to be updated, $N_G$ is the total number of variable nodes in each group of variable nodes, "\n" denotes excluding n, and $Q_{nm}$ is the message received from variable node n to check node m. The above equation (5) utilizes the scaled min-sum update using a scalar. The sign( ) operation outputs the sign (e.g., positive or negative 1). The min( ) operation selects the smallest value.

The equation below is an alternative message $R_{mn}^{(k)}$ using an offset min-sum update with an offset β.

$$R_{mn}^{(k)} = \left( \prod_{\substack{n' = \mathcal{N}(m)\backslash n \\ n' \leq g \cdot N_G}} \text{sign}(Q_{n'm}^{(k)}) \right) \times \left( \prod_{\substack{n' = \mathcal{N}(m)\backslash n \\ n' \geq g \cdot N_G+1}} \text{sign}(Q_{n'm}^{(k-1)}) \right) \times \quad (6)$$

$$\max \left( \min \left( \min_{\substack{n' = \mathcal{N}(m)\backslash n \\ n' \leq g \cdot N_G}} |Q_{n'm}^{(k)}|, \min_{\substack{n' = \mathcal{N}(m)\backslash n \\ n' \geq g \cdot N_G+1}} |Q_{n'm}^{(k-1)}| \right) - \beta, 0 \right)$$

By utilizing the min-sum update, calculation of the hyperbolic tangent and inverse hyperbolic tangent are avoided. For example, a version of equation (5) not using the min-sum update is given below.

$$R_{mn}^{(k)} = \quad (7)$$

$$\left( \prod_{\substack{n' = \mathcal{N}(m)\backslash n \\ n' \leq g \cdot N_G}} \text{sign}(Q_{n'm}^{(k)}) \right) \times 2\tanh^{-1} \left( \prod_{\substack{n' = \mathcal{N}(m)\backslash n \\ n' \leq g \cdot N_G}} \tanh\left(\frac{|Q_{n'm}^{(k)}|}{2}\right) \right) \times$$

$$\left( \prod_{\substack{n' = \mathcal{N}(m)\backslash n \\ n' \geq g \cdot N_G+1}} \text{sign}(Q_{n'm}^{(k-1)}) \right) \times 2\tanh^{-1} \left( \prod_{\substack{n' = \mathcal{N}(m)\backslash n \\ n' \leq g \cdot N_G+1}} \tanh\left(\frac{|Q_{n'm}^{(k)}|}{2}\right) \right)$$

One drawback to utilizing equation (5) is that all Q-messages (i.e., message from variable nodes to check nodes) have to be saved. For example, because not all variable node groups are updated at the same time to provide the latest Q-message of the current decoding iteration, Q-messages from variable nodes that have not been updated are not available to be utilized to generate the R-message. For Q-messages that have not been provided, Q-messages from a prior decoding iteration (e.g., $Q_{n,m}^{(k-1)}$) are utilized in equation (5). This requires Q-messages from a prior decoding iteration to be saved for use in a future decoding iteration. Specifically for equation (5), the number of Q-messages required to be saved is the number of '1's in the parity-check matrix. Saving all Q-messages of a decoding iteration may require a significant amount of memory that may be cost and performance ineffective to implement.

As observed in equation (5), only the smallest two Q-messages in a row are used to update R-messages. The smallest Q-message in a row m is used to update all the R-messages in the variable node updates associated with row m except column n to which the smallest Q-message belongs. The second smallest Q-message will be used to update the R-message of the column n to which the smallest Q-message belongs. Thus at least two smallest Q-messages and the location of the smallest Q-message need to be saved. However, when a variable node update happens on column n, where the smallest Q-message on the row m belongs, the resulting Q-message becomes very large such that the second smallest Q-message becomes the smallest one, leaving nothing to update the location of the smallest Q-message. In other words, the location of the second smallest Q-message needs to be saved in case it becomes the smallest one during the shuffled decoding process. The similar situation may arise for the second smallest Q-message whenever a variable node update is performed on the column belonging to it. Thus, the third smallest Q-message and its associated location may need to be saved. This line of reasoning can be iterated until all Q-messages on a row are saved. However, close results may be approximated by only saving a select number of smallest Q-messages. For example, as shown in graph 720 of FIG. 7B, saving smallest 3 or even 2 Q-messages and their locations results in negligible performance degradation. In some embodiments, for the case where the largest pair of the save Q-messages gets updated, the resulted Q-message and its location from the associated variable node update are utilized to replace it.

In some embodiments, two smallest Q-messages and their locations (e.g., from which variable node for which check node) are saved and other Q-messages are not saved for use in future decoding iterations (e.g., discarded). The two saved Q-messages may be specified using the equations below as R1 and R2 and their corresponding locations described in the equations below as N(R1) and N(R2). The max( ) operation selects the largest value. In some embodiments, the approximation using only two smallest Q-messages and their locations may need to use the following equations (8), (9) and (10).

$$R1_m^{(k,g)} = \begin{cases} \min(R2_m^{(k,g-1)}, Q_{nm}^{(k)}) & \text{if } N(R1_m^{(k,g-1)}) == n \\ \min(R1_m^{(k,g-1)}, Q_{nm}^{(k)}) & \text{else} \end{cases} \quad (8)$$

$$N(R1_m^{(k,g)}) = \begin{cases} N(R1_m^{(k,g-1)}) & \text{if } R1_m^{(k,g)} \leftarrow R1_m^{(k,g-1)} \\ N(R2_m^{(k,g-1)}) & \text{if } R1_m^{(k,g)} \leftarrow R2_m^{(k,g-1)} \\ n & \text{if } R1_m^{(k,g)} \leftarrow Q_{nm}^{(k)} \end{cases}$$

$$R2_m^{(k,g)} = \begin{cases} \max(R1_m^{(k,g-1)}, Q_{nm}^{(k)}) & \text{if } N(R2_m^{(k,g-1)}) == n \\ \max(R2_m^{(k,g-1)}, Q_{nm}^{(k)}) & \text{if } N(R1_m^{(k,g-1)}) == n \\ \max(R2_m^{(k,g-1)}, \max(R1_m^{(k,g-1)}, Q_{nm}^{(k)})) & \text{else} \end{cases} \quad (9)$$

$$N(R2_m^{(k,g)}) = \begin{cases} N(R1_m^{(k,g-1)}) & \text{if } R2_m^{(k,g)} \leftarrow R1_m^{(k,g-1)} \\ N(R2_m^{(k,g-1)}) & \text{if } R2_m^{(k,g)} \leftarrow R2_m^{(k,g-1)} \\ n & \text{if } R2_m^{(k,g)} \leftarrow Q_{nm}^{(k)} \end{cases}$$

Using R1, R2, N(R1) and N(R2), previous equation (1) may be updated to be the following equation.

$$R_{mn}^{(k)} = \alpha \left( \prod_{\substack{n' = \mathcal{N}(m)\backslash n \\ n' \leq g \cdot N_G}} \text{sign}(Q_{n'm}^{(k)}) \right) \times \quad (10)$$

$$\left( \prod_{\substack{n' = \mathcal{N}(m)\backslash n \\ n' \geq g \cdot N_G+1}} \text{sign}(Q_{n'm}^{(k-1)}) \right) \times \begin{cases} R1_m^{(k,g)} & \text{if } N(R1_m^{(k,g)}) \,!= n \\ R2_m^{(k,g)} & \text{else} \end{cases}$$

Although saving two smallest Q-messages is shown in the equations, the equations may be modified to support saving any number of Q-messages, including saving 3 smallest Q-messages and their locations (e.g., n for the m).

In some embodiments as shown in equations (5) and (10), at iteration k, after update of a certain group (e.g., group g) of variable nodes, the check node update requires that all the messages from variable nodes in groups 1 to g are the latest updated messages at iteration k. The messages from variable nodes in groups g+1 to G may be the previously updated messages at iteration k−1. However, if multiple clock cycles are set to correspond to the time required to update one group of variable nodes, it may limit decoder throughput by limiting the ability to pipeline variable node updates into multiple processing stages. In some embodiments, a delay (e.g., variable d) is introduced for the requirement of which groups should contain the latest updated variable messages when the check node updates are to begin. For example, at iteration k, after group g of the variable nodes are updated, the check node update only requires the latest updated variable node messages of group 1 and g−d while the messages of variable nodes of groups g−d+1 to G (G is the total number groups) are only updated at previously iteration k−1. By introducing the delay, check node updates and variable node updates may be effectively interleaved and pipelined to achieve higher decoder throughput. This allows delay variable d to be added to equations (8), (9) and (10) to arrive at the equations (11), (12) and (13), respectively, below.

$$R1_m^{(k,g-d)} = \begin{cases} \min(R2_m^{(k,g-d-1)}, Q_{nm}^{(k)}) & \text{if } N(R1_m^{(k,g-d-1)}) == n \\ \min(R1_m^{(k,g-d-1)}, Q_{nm}^{(k)}) & \text{else} \end{cases} \quad (11)$$

$$N(R1_m^{(k,g-d)}) = \begin{cases} N(R1_m^{(k,g-d-1)}) & \text{if } R1_m^{(k,g-d)} \leftarrow R1_m^{(k,g-d-1)} \\ N(R2_m^{(k,g-d-1)}) & \text{if } R1_m^{(k,g-d)} \leftarrow R2_m^{(k,g-d-1)} \\ n & \text{if } R1_m^{(k,g-d)} \leftarrow Q_{nm}^{(k)} \end{cases}$$

$$R2_m^{(k,g-d)} = \begin{cases} \max(R1_m^{(k,g-d-1)}, Q_{nm}^{(k)}) & \text{if } N(R2_m^{(k,g-d-1)}) == n \\ \max(R2_m^{(k,g-d-1)}, Q_{nm}^{(k)}) & \text{if } N(R1_m^{(k,g-d-1)}) == n \\ \max(R2_m^{(k,g-d-1)}, \max(R1_m^{(k,g-d-1)}, Q_{nm}^{(k)})) & \text{else} \end{cases} \quad (12)$$

$$N(R2_m^{(k,g-d)}) = \begin{cases} N(R1_m^{(k,g-d-1)}) & \text{if } R2_m^{(k,g-d)} \leftarrow R1_m^{(k,g-d-1)} \\ N(R2_m^{(k,g-d-1)}) & \text{if } R2_m^{(k,g-d)} \leftarrow R2_m^{(k,g-d-1)} \\ n & \text{if } R2_m^{(k,g-d)} \leftarrow Q_{nm}^{(k)} \end{cases}$$

$$R_{mn}^{(k,g-d)} = \alpha \left( \prod_{\substack{n' = \mathcal{N}(m)\backslash n \\ n' \leq g \cdot N_G}} \text{sign}(Q_{n'm}^{(k)}) \right) \times \quad (13)$$

$$\left( \prod_{\substack{n' = \mathcal{N}(m)\backslash n \\ n' \geq g \cdot N_G+1}} \text{sign}(Q_{n'm}^{(k-1)}) \right) \times \begin{cases} R1_m^{(k,g-d)} & \text{if } N(R1_m^{(k,g-d)}) \,!= n \\ R2_m^{(k,g-d)} & \text{else} \end{cases}$$

At 508, it is determined whether all variable node groups have been updated. For example, it is determined whether all variable nodes have been updated in the current decoding iteration. In some embodiments, determining whether all variable node groups have been updated includes determining whether an identifier of a currently processing variable group is equal to an identifier of a total number of groups. For example, it is determined whether g=G (e.g., g is not less than G).

If at 508, it is determined that the all variable node groups have been updated, at 510 it is determined that one decoding iteration has been completed and the process ends. For example, the process proceeds to 406 of FIG. 4.

If at 508, it is determined that the all variable node groups have not been updated, the process returns to 502. For example, at 502, an identifier of a currently processing group is incremented (e.g., variable g is incremented).

Figure 6:
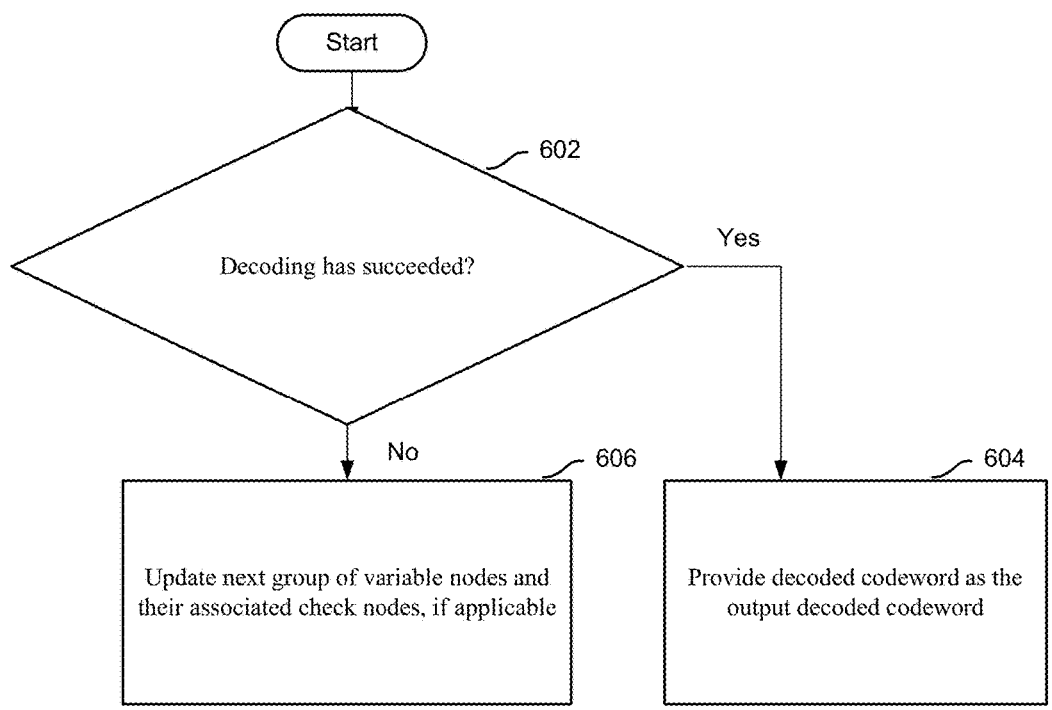
FIG. 6 is a flowchart illustrating an embodiment of a process for determining whether to end decoding before a decoding iteration has been completed.

FIG. 6 is a flowchart illustrating an embodiment of a process for determining whether to end decoding before a decoding iteration has been completed. The process of FIG. 6 may be implemented on LDPC decoder 206 of FIG. 2 and/or LDPC decoder 300 of FIG. 3. In some embodiments, the process of FIG. 6 is included in 404 of FIG. 4 (e.g., rather than performing steps 406-410) and/or 506/508 of FIG. 5. Traditionally the determination of whether to stop decoding because the correct desired codeword has been decoded was performed after each decoding iteration was completed. However by dividing nodes into groups for separate processing (e.g., using the process of FIG. 5), the check for whether to stop decoding because the codeword has been successfully decoded may be performed after a group update rather than waiting until all the groups have been updated to complete each decoding iteration. For example, a stopping criterion is tested after each variable node group update.

At 602, it is determined whether the decoding has succeeded. For example, the determination of whether the decoding has succeeded is performed prior to completion of a decoding iteration (e.g., not all nodes have been updated). In some embodiments, determining whether decoding has succeeded includes determining a decoded codeword (e.g., codeword decoded from decoded LLR values). For example, the decoded LLR value $Q_n$ of each variable node n (of N total variable nodes) (e.g., old $Q_n$ from previous decoding iteration utilized if updated $Q_n$ of the current decoding iteration is not available) is decoded to generate decoded codeword $\hat{c}=[\hat{c}_1, \hat{c}_2, \ldots, \hat{c}_{N-1}]$ (for $1 \leq n \leq N$) using the following:

$$\hat{c}_n = \begin{cases} 0 \text{ if } Q_n \geq 0 \\ 1 \text{ if } Q_n < 0 \end{cases} \tag{14}$$

In some embodiments, determining whether the decoding has succeeded includes determining whether the decoded codeword multiplied by the parity check matrix equals the success syndrome (e.g., all zero matrix in the case of no error). For example, if for parity check matrix H, H$\hat{c}$=0, then it is determined that decoding is successful and all errors have been removed from the codeword. In some embodiments, if H$\hat{c}\neq 0$, it is determined that decoding has not succeeded.

Performing a matrix multiplication of H$\hat{c}$ for each group update may utilize an undesirably large amount of resources. Rather than performing the entire matrix multiplication, only the components that have changed from an earlier calculation may be utilized to update the decoded codeword and associated syndrome. In some embodiments, a memory/storage of codeword length is utilized to save all decoded codeword $\hat{c}$ bits from the last decoding iteration and a memory/storage of parity length (e.g., number of check nodes) to save all the syndrome values of the last decoding iteration. For example, the decoded codeword $\hat{c}$ of each decoding iteration is saved along with the associated resulting syndrome when the decoded codeword is multiplied with the parity check matrix.

In some embodiments, the decoded LLR value $Q_n^{(k,g)}$ of each variable node n, such that $(g-1) \cdot N_G + 1 \leq n \leq g \cdot N_G$, where g is the identifier of the current group of variable nodes updated and $N_G$ is the total number of variable nodes in each group and k is the identifier of the current decoding iteration, is utilized to update a value of the decoded codeword bit $\hat{c}_n^{(k)}$ as specified in the equation below.

$$\hat{c}_n^{(k)} = \begin{cases} 0 \text{ if } Q_n^{(k,g)} >= 0 \\ 1 \text{ otherwise} \end{cases} \tag{15}$$

Using equation (15) to determine whether a codeword is converged or not may save decoding time and thus improve throughput, latency and power. Then for each variable node n, such that $(g-1) \cdot N_G + 1 \leq n \leq g \cdot N_G$ and each check node m connected to the variable node n (i.e., $m \in \mathcal{M}(n)$), the following equation (16) is utilized to update the syndrome bits $s_{m(k,g)}$, where $s_m^{(k,g-1)}$ is the corresponding syndrome bit from the previous group update that is XOR-ed with $\hat{c}_n^{(k-1)}$, the corresponding decoded codeword bit of the previous decoding iteration, and XOR-ed with $\hat{c}_n^{(k)}$, the corresponding decoded codeword bit of the current decoding iteration.

$$s_m^{(k,g)} = s_m^{(k,g-1)} \hat{c}_n^{(k-1)} \hat{c}_n^{(k)} \tag{16}$$

If $s_m$ is 0 for all check node m, it is determined that decoding has succeeded. If $s_m$ is not 0 for all check node m, it is determined that decoding has not succeeded.

If at 602 it is determined that decoding has succeeded, at 604, the decoded codeword (e.g., $\hat{c}$) is provided as the output decoded codeword and the decoding process ends.

If at 602 it is determined that decoding has not succeeded, at 606, the next group of variable nodes and their associated check nodes are updated, if applicable. For example, at 606 the process proceeds to 508 of FIG. 5.

Figure 7C:
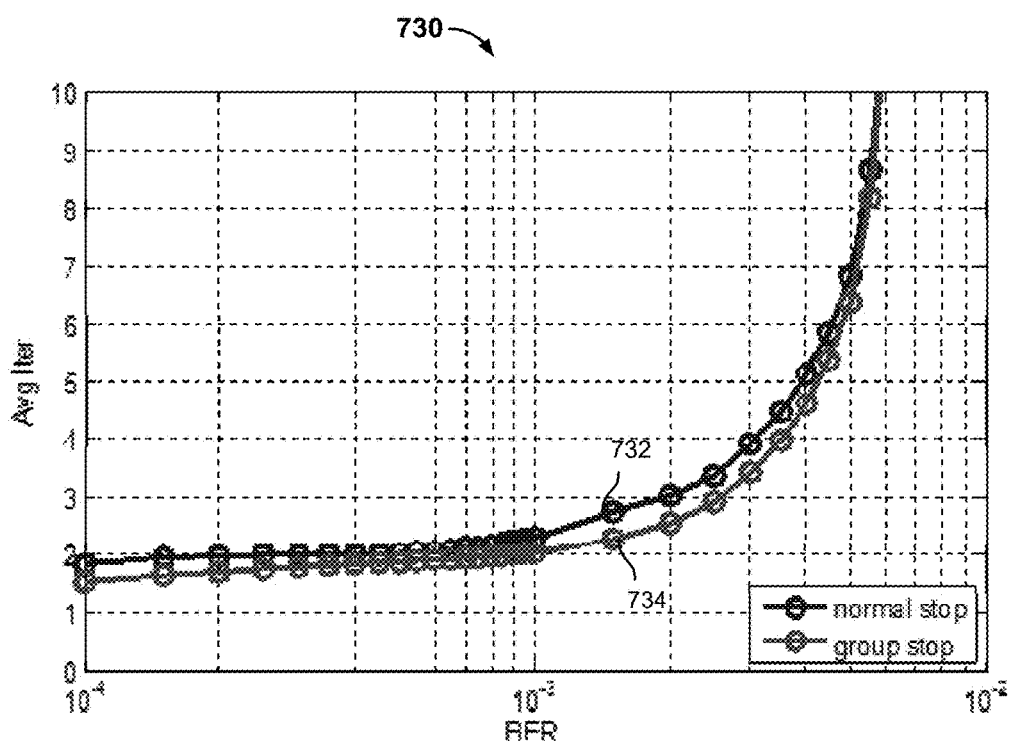
FIG. 7C is a graph showing an experimental simulation of performance comparison between only checking for successful decoding after each decoding iteration vs. after each group update.

FIG. 7C is a graph showing an experimental simulation of performance comparison between only checking for successful decoding after each decoding iteration vs. after each group update. Graph 730 plots bit error rate (BER) vs average number of decoding iterations of normal checking for successful decoding after each decoding iteration implementation (line 732) as compared to checking for successful decoding after each group update (line 734). As shown in graph 730, there is a performance improvement for check after each group update rather than the normal implementation.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for decoding an LDPC encoded codeword, comprising:
   variable nodes, the variable nodes correspond to columns of a parity check matrix of the LDPC encoded codeword, and are divided into a plurality of groups;
   check nodes, the check nodes correspond to rows of the parity check matrix of the LDPC encoded codeword;

a variable node updater configured to update a selected group of the variable nodes from the plurality of groups of the variable nodes, the variable node updater generates input values from the selected group of the variable nodes to correlated check nodes thereof, and decoded values from the selected group of the variable nodes;

a check node updater configured to update the check nodes using a min-sum update, the check nodes receive corresponding input values from correlated variable nodes, a portion of the corresponding input values of the selected group of the variable nodes is saved for use in a future min-sum update as saved input values; and a codeword updater configured to calculate codewords in accordance with the decoded values, and output a decoded codeword when the codewords are error free.

2. The system of claim 1, wherein the system is implemented on an integrated circuit chip.

3. The system of claim 1, wherein updating the selected group of variable nodes from the plurality of groups of variable nodes includes not updating another group of variable nodes from the plurality of groups of variable nodes.

4. The system of claim 1, wherein the variable node updater is further configured to pipeline an update of another group of variable nodes from the plurality of groups of variable nodes while the selected group of variable nodes is being updated.

5. The system of claim 1, wherein the updating the selected group of the variable nodes includes providing the input values to the correlated check nodes, wherein the correlated check nodes are determined in accordance with the parity check matrix.

6. The system of claim 1, wherein the min-sum update is a scaled min-sum update using a scalar value.

7. The system of claim 1, wherein the min-sum update is an offset min-sum update using an offset value.

8. The system of claim 1, wherein updating check nodes using the min-sum update includes not calculating an inverse hyperbolic tangent.

9. The system of claim 1, wherein updating the check nodes includes using previous decoding iteration input values from variable nodes of one or more variable node groups that have been already updated in a current decoding iteration.

10. The system of claim 1, wherein updating the check nodes includes using previous decoding iteration input values from at least a delay number of variable node groups that have been most recently updated in a current decoding iteration.

11. The system of claim 1, wherein the check node updater is further configured to update the check nodes each time when another group of variable nodes from the plurality of groups of variable nodes is updated.

12. The system of claim 1, further comprising another portion of the corresponding input values is discarded for use in the future min-sum update.

13. The system of claim 1, wherein the updating the check nodes using the min-sum update includes updating the check nodes in accordance with the corresponding input values of the selection group of the variable nodes in a current decoding iteration, and the corresponding input values are saved for use in the future min-sum update when the corresponding input values from the same variable node are previously saved.

14. The system of claim 1, wherein the corresponding input values are messages from each of the variable nodes of the selected group to each of the correlated check nodes thereof.

15. The system of claim 1, further comprising discarded input values, wherein the discarded input values are another portion of the corresponding input values discarded for use in the future min-sum update, and are not smaller than the saved input values.

16. The system of claim 1, further comprising a syndrome updater configured to determine whether the codewords are error free in accordance with the corresponding input values.

17. The system of claim 1, wherein the updating the check nodes using the min-sum update includes updating the check nodes in accordance with the corresponding input values of the selection group of the variable nodes in a current decoding iteration and the saved input values of a previous decoding iteration.

18. The system of claim 1, further comprising a determination of the codewords are error free includes determining whether the codewords are error free prior to updating all of the variable nodes corresponding to the parity check matrix in a current decoding iteration.

19. The system of claim 1, further comprising a determination of the codewords are error free includes determining whether the codewords are error free by using the input values of the check nodes from a previous decoding iteration if the input values of the current decoding iteration is not available.

20. The system of claim 1, further comprising a determined syndrome using the decoded codeword is saved for future determination of the determined syndrome.

21. The system of claim 20, wherein the determined syndrome is determined using at least a portion of the saved determined syndrome of a previous decoding iteration, and a decoded codeword bit of a current decoding iteration.

22. A method for decoding an LDPC encoded codeword, comprising:

updating a selected group of variable nodes from a plurality of groups of the variable nodes, wherein the variable nodes are corresponding to columns of a parity check matrix of the LDPC encoded codeword and are divided into the plurality of groups, input values are generated from the selected group of the variable nodes to correlated check nodes thereof, and decoded values are generated from the selected group of the variable nodes;

updating check nodes using a min-sum update, wherein the check nodes correspond to rows of the parity check matrix of the LDPC encoded codeword, the check nodes receive corresponding input values from correlated variable nodes, a portion of the corresponding input values of the selected group of the variable nodes is saved for use in a future min-sum update; and calculating codewords in accordance with the decoded values, and outputting a decoded codeword when the codewords are error free.

23. A non-transitory computer program product for decoding an LDPC encoded codeword comprising:

a processor; and a tangible computer readable storage medium coupled to the processor, embedding the non-transitory computer program product executed by the processor, including computer instructions suitable for:

updating a selected group of variable nodes from a plurality of groups of the variable nodes, wherein the variable nodes are corresponding to columns of a parity check matrix of the LDPC encoded codeword and are divided into the plurality of groups, input values are generated from the selected group of the variable nodes to correlated check nodes thereof, and decoded values are generated from the selected group of the variable nodes;

updating check nodes using a min-sum update, wherein the check nodes correspond to rows of the parity check matrix of the LDPC encoded codeword, the check nodes receive corresponding input values from correlated variable nodes, a portion of the corresponding input values of the selected group of the variable nodes is saved for use in a future min-sum update; and calculating codewords in accordance with the decoded values, and outputting a decoded codeword when the codewords are error free.

* * * * *